US008963145B2

(12) United States Patent
Lee

(10) Patent No.: US 8,963,145 B2
(45) Date of Patent: Feb. 24, 2015

(54) OLED TOUCH DISPLAY PANEL STRUCTURE

(71) Applicant: SuperC-Touch Corporation, New Taipei (TW)

(72) Inventor: Hsiang-Yu Lee, New Taipei (TW)

(73) Assignee: SuperC-Touch Corporation, New Taipei (TW)

( * ) Notice: Subject to any disclaimer, the term of this patent is extended or adjusted under 35 U.S.C. 154(b) by 0 days.

(21) Appl. No.: 14/267,343

(22) Filed: May 1, 2014

(65) Prior Publication Data

US 2014/0326967 A1 Nov. 6, 2014

(30) Foreign Application Priority Data

May 3, 2013 (TW) .............................. 102208235 U

(51) Int. Cl.
*H01L 27/32* (2006.01)
*G06F 3/041* (2006.01)

(52) U.S. Cl.
CPC ............ *H01L 27/323* (2013.01); *G06F 3/0412* (2013.01)
USPC .......................................................... 257/40

(58) Field of Classification Search
CPC ...... H01L 27/323; G06F 3/041; G06F 3/0412
See application file for complete search history.

(56) References Cited

U.S. PATENT DOCUMENTS

2010/0123680 A1* 5/2010 Lee et al. ....................... 345/174
2014/0204055 A1* 7/2014 Lu et al. ........................ 345/174

* cited by examiner

*Primary Examiner* — Erik Kielin
(74) *Attorney, Agent, or Firm* — Muncy, Geissler, Olds & Lowe, P.C.

(57) ABSTRACT

An OLED touch display panel structure includes an upper substrate, a lower substrate, a cathode layer, an anode layer, and a thin film transistor and sensing electrode layer. The thin film transistor and sensing electrode layer includes a scan line sub-layer and a data line sub-layer. The scan line sub-layer has a plurality of scan lines arranged in a first direction and a plurality of sensing conductor segments arranged in a second direction. The plurality of sensing conductor segments arranged in the second direction are separated by the plurality of scan lines. The data line sub-layer is disposed at one side of the scan line sub-layer facing the OLED layer and has a plurality of data lines arranged in the second direction and a plurality of sensing conductor segments arranged in the first direction. The plurality of sensing conductor segments arranged in the first direction are separated by the plurality of scan lines.

12 Claims, 10 Drawing Sheets

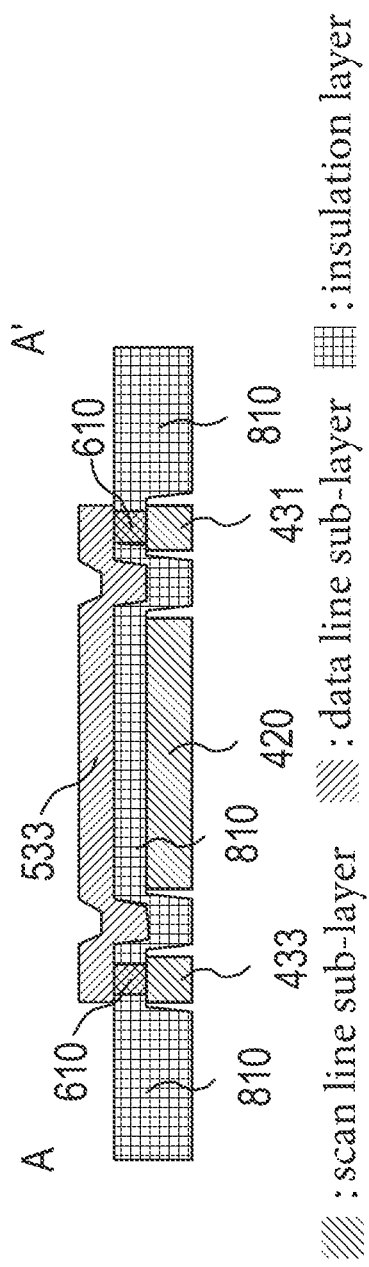
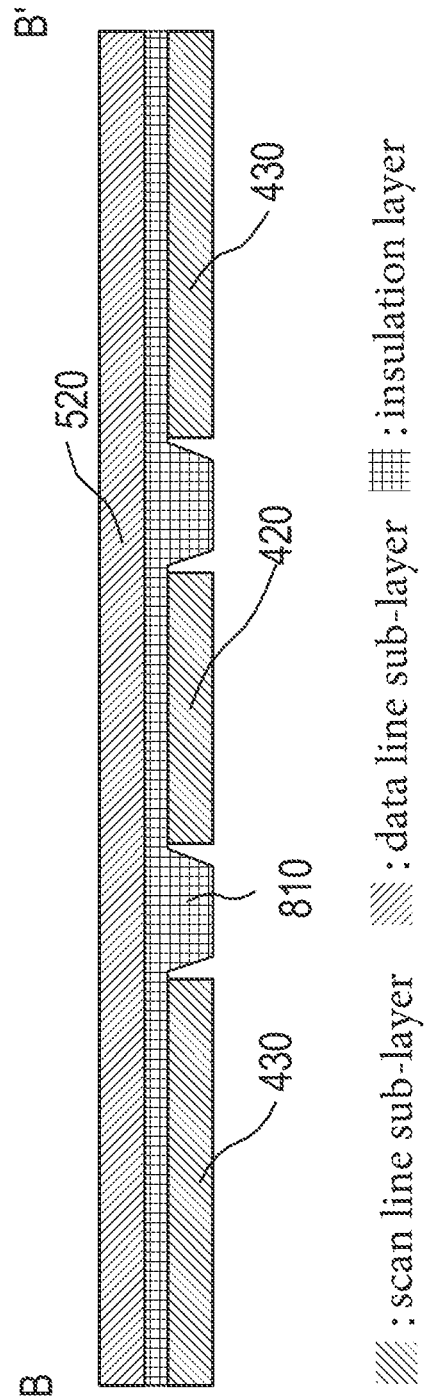
FIG. 8(A)
FIG. 8(B)

OLED TOUCH DISPLAY PANEL STRUCTURE

BACKGROUND OF THE INVENTION

1. Field of the Invention

The present invention relates to a structure of touch display panel and, more particularly, to an OLED touch display panel structure.

2. Description of Related Art

In recent year, the flat panel display industry has been rapidly developed, and many products have also been made in pursuit of light weight, thinness, small volume and fine image quality for developing several types of flat-panel displays to replace traditional cathode ray tube display (CRT). FIG. 1 schematically illustrates the types of known display panels. As shown in FIG. 1, the flat panel display includes liquid crystal display (LCD), plasma display panel (PDP), organic light emitting diode (OLED) display, field emission display (FED), and vacuum fluorescence display (VFD).

Among these types of flat panel displays, the organic light emitting diode display (OLED) technology is the one with great potential. OLED was first published by Eastman Kodak Co. in 1987. It has the features of thinness, light weight, self-illumination, low driving voltage, high efficiency, high contrast, high color saturation, fast response, flexibility, etc., and is therefore deemed as positively evaluated display technology following the TFT-LCD. In recent years, due to the development of mobile communications, digital products and digital televisions, the demand for high-quality full-color flat-panel displays is rapidly increased. The OLED display is provided with not only the advantages of LCD display including thinness, power-saving, and full-color display, but also the features of wide viewing angle, self-illumination, and fast response that are better than LCD.

FIG. 2 schematically illustrates the basic structure of conventional OLED display. The OLED display 200 includes a cathode layer 210, an OLED layer 220, an anode layer 230, a thin film transistor layer 240, a lower substrate 250, and an upper substrate 260, wherein the OLED layer 220 further includes a hole transporting layer (HTL) 221, an emitting layer 223, and an electron transporting layer (ETL) 225.

The light-emitting principle of OLED is such that the electrons and electric holes are injected from the cathode layer 210 and the anode layer 230 respectively by applying electric field and, after the electric holes pass through the electric hole transport sub-layer 221 and electrons pass through the electron transport sub-layer 225, the electrons and electric holes enter the light-emitting layer 223 with fluorescent characteristics and then are combined to produce excited photons, which immediately release energy and return to the ground state. The released energy will generate different colors of light based on different luminescent materials, so as to cause OLED to emit light.

The conventional OLED display 200 has a cathode layer 260 disposed below the upper substrate 260. The cathode layer 210 can be used to isolate the noise from the top of the upper substrate 260 and receive current of the pixel electrodes of the anode layer 230, so as to control the illumination of light emitting layer 223.

The conventional touch display panel includes a touch panel and a display unit overlapped with the touch panel. The touch panel is configured as an operation interface. The touch panel is transparent so that an image generated by the display unit can be viewed directly by a user without being sheltered by the touch panel. Such well known skill of the touch panel may increase additional weight and thickness of the touch display panel, and may further reduce the light penetration rate, and increase reflectance and haze of the touch display panel.

On-cell and in-cell touch technology are invented to overcome the drawbacks of traditional touch technology described above. The on-cell technology is to dispose a touch sensor on a thin film and then bond the thin film onto the upper one of the upper glass substrate layer. The in-cell touch technology is provided to integrate the touch sensor within the display unit so that the display unit is provided with the ability of the touch panel. Therefore, the touch display panel does not need to be bonded with an additional touch panel so as to simplify the assembly procedure. Such skill is generally developed by display panel manufactures.

For the on-cell touch technology, it needs a sensing layer to be configured on an upper glass substrate or needs to use an upper substrate to increase touch sensing electrode, which not only increases the manufacturing cost but also complicates the manufacturing process, and which may also lower the aperture ratio and thus higher the manufacturing cost. Therefore, it desired for the aforementioned OLED touch display panel structure to be improved.

SUMMARY OF THE INVENTION

The object of the present invention is to provide an OLED touch display panel structure, which uses in-cell touch technology on OLED display panel and also significantly reduces the material and manufacturing cost, so as to provide the OLED display panel with touch function.

To achieve the object, there is provided an OLED touch display panel structure, which comprises: an upper substrate, a lower substrate, a cathode layer, an anode layer, and a thin film transistor and sensing electrode layer. The upper substrate and the lower substrate are parallel to each other and the OLED layer is disposed between the upper and lower substrates. The cathode layer is disposed at one side of the upper substrate facing the OLED layer. The anode layer is disposed at one side of the lower substrate facing the OLED layer and includes a plurality of anode pixel electrodes. The thin film transistor and sensing electrode layer is disposed between the lower substrate and the anode layer and includes a scan line sub-layer and a data line sub-layer. The scan line sub-layer has a plurality of scan lines arranged in a first direction and a plurality of sensing conductor segments arranged in a second direction, wherein the plurality of sensing conductor segments arranged in the second direction are separated by the plurality of scan lines. The data line sub-layer is disposed at one side of the scan line sub-layer facing the OLED layer and has a plurality of data lines arranged in the second direction and a plurality of sensing conductor segments arranged in the first direction, wherein the plurality of sensing conductor segments arranged in the first direction are separated by the plurality of scan lines.

BRIEF DESCRIPTION OF THE DRAWINGS

FIG. 8(A) and FIG. 8(B) are two cross sectional views taking along A-A' and B-B' lines of FIG. 7, respectively;

DETAILED DESCRIPTION OF THE PREFERRED EMBODIMENT

Figure 1:
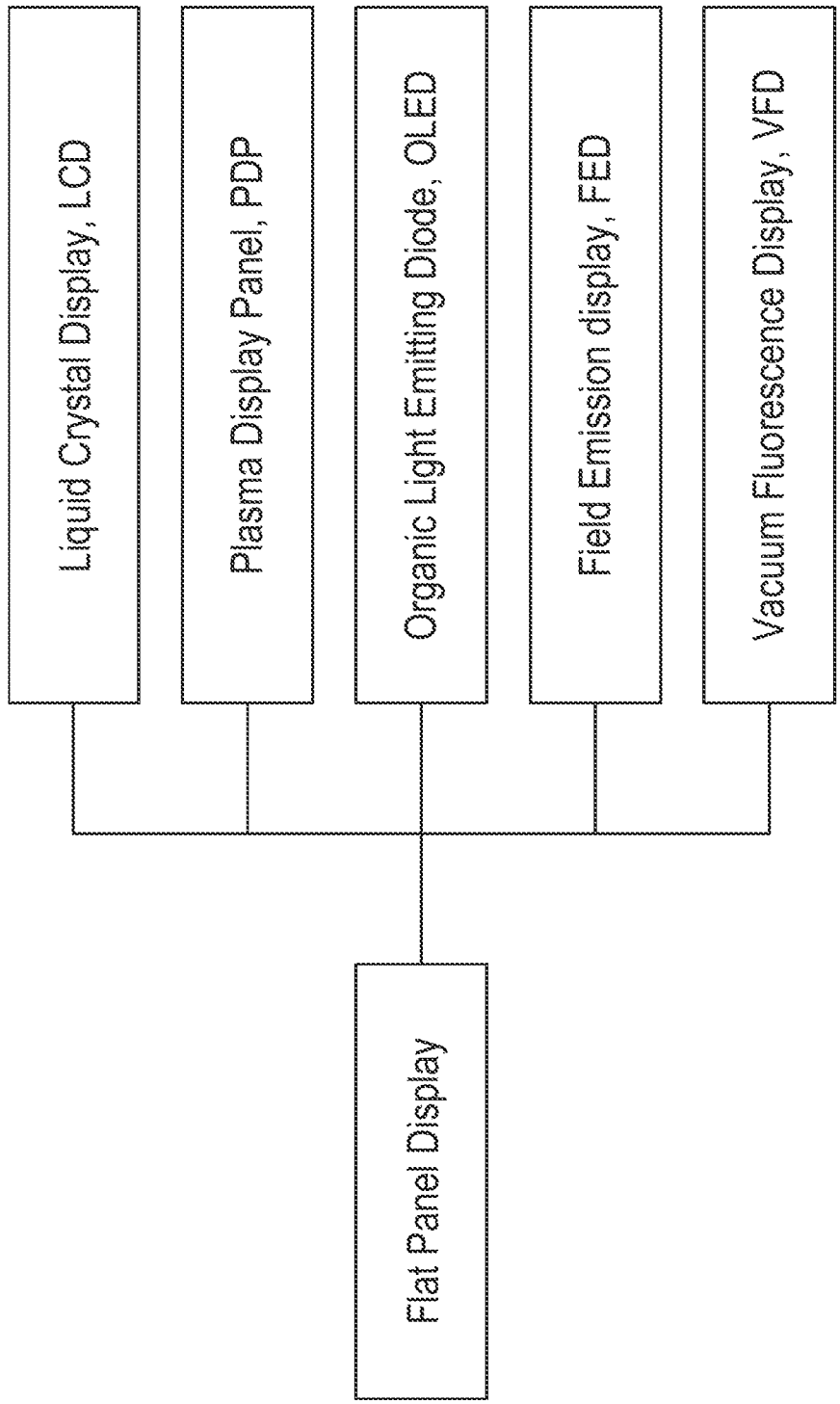
FIG. 1 schematically illustrates the types of conventional display panel.
Figure 2:
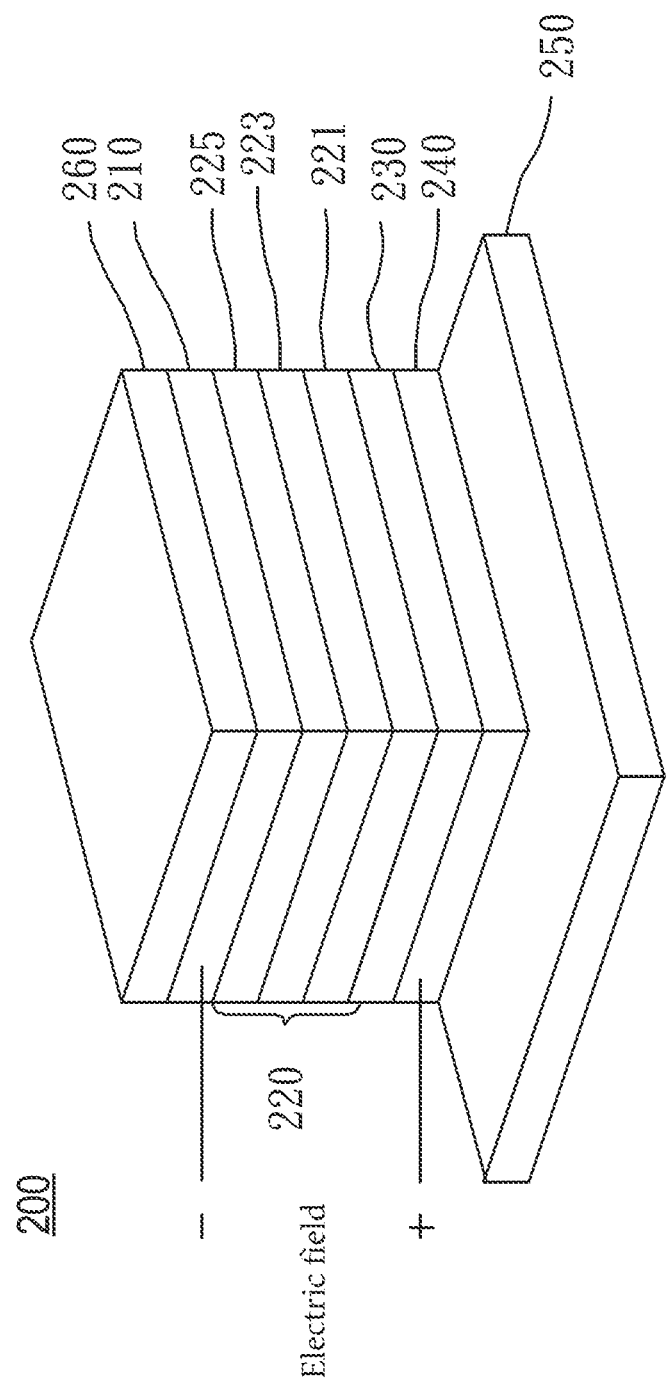
FIG. 2 schematically illustrates the basic structure of a conventional OLED.
Figure 3:
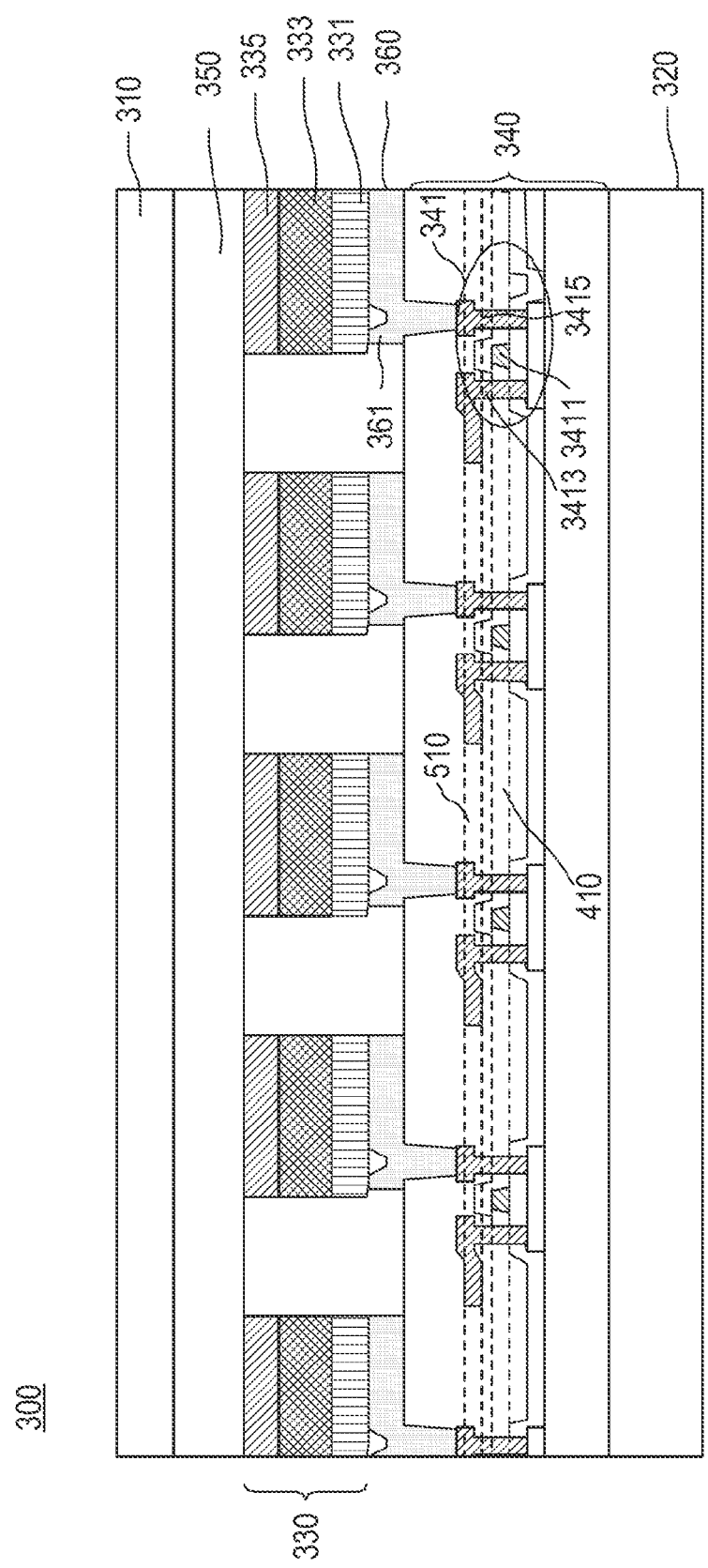
FIG. 3 is cross sectional view of an OLED touch display panel structure in accordance with the present invention.

The present invention relates to an OLED touch display panel structure. FIG. 3 is a cross sectional view of the OLED touch display panel structure 300 in accordance with the present invention. The OLED touch display panel structure 300 includes an upper substrate 310, a lower substrate 320, an OLED layer 330, a thin film transistor and sensing electrode layer 340, a cathode layer 350, and an anode layer 360.

The upper substrate 310 and the lower substrate 320 are preferably glass substrates and are parallel to each other. The OLED layer 330 is disposed between the upper and lower substrates 310, 320.

The conventional thin film transistor (TFT) layer is disposed at one side of the lower substrate 320 that faces the OLED layer 330. The conventional TFT layer is formed with the thin film transistor and transparent electrode.

In the present invention, a plurality of sensing conductor segments are provided on the conventional thin film transistor layer on which a sensing touch pattern structure is defined, so as to form the thin film transistor and sensing electrode layer 340 in accordance with the present invention. Therefore, there is no need to arrange a sensing electrode layer on the upper glass substrate or the lower glass substrate of a display panel, so as to reduce the manufacturing cost, simplify the manufacturing process and increase the yield rate. The thin film transistor and sensing electrode layer 340 is disposed at one side of the lower substrate 320 that faces the OLED layer 330. The thin film transistor and sensing electrode layer 340 includes a scan line sub-layer 410 and a data line sub-layer 510 (FIG. 3 only shows the position range of the scan line sub-layer and data line sub-layer).

Figure 4:
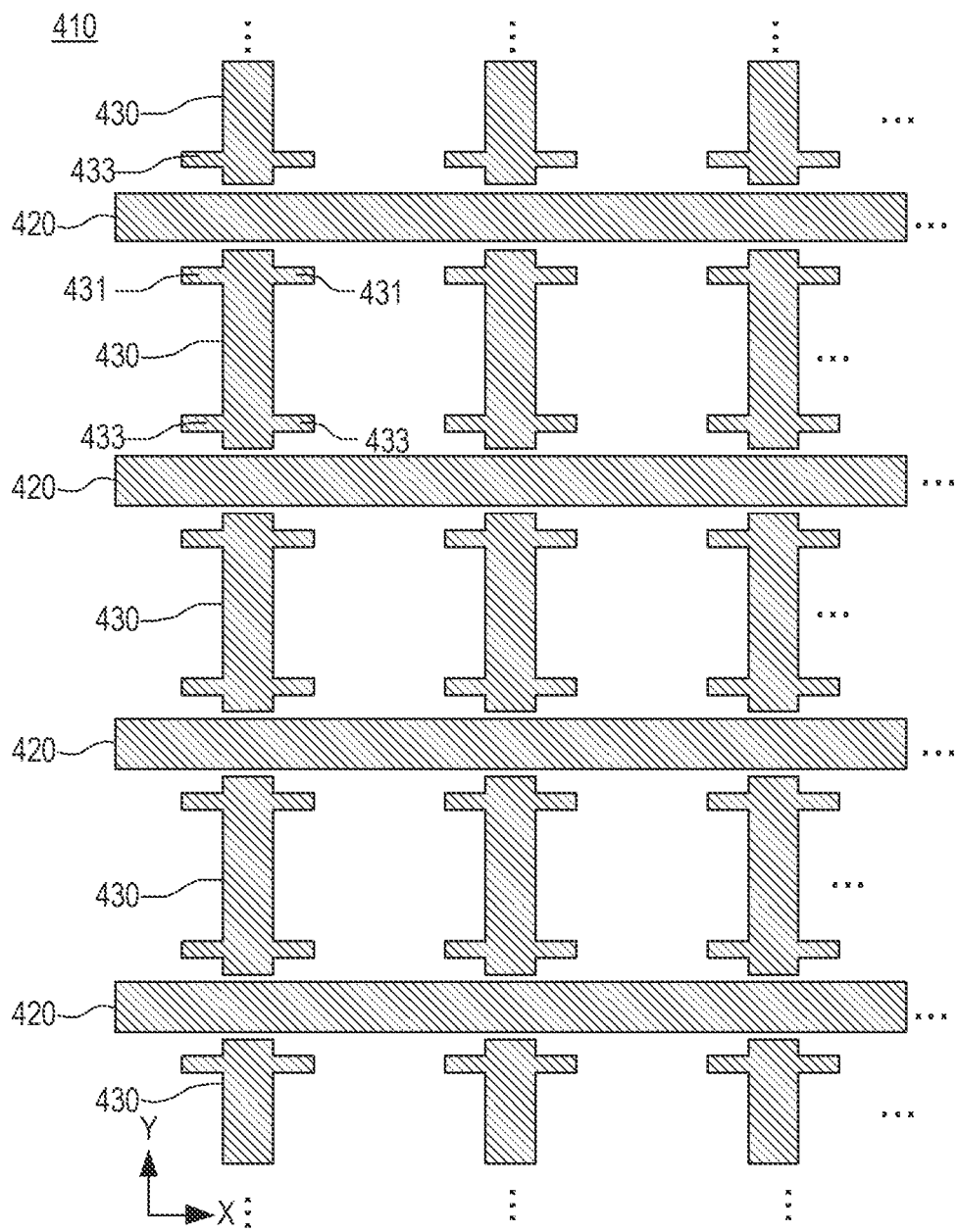
FIG. 4 schematically illustrates the scan line sub-layer in accordance with the present invention.

FIG. 4 schematically illustrates the scan line sub-layer in accordance with the present invention. The scan line sub-layer 410 has a plurality of scan lines 420 arranged in a first direction (X-direction) and a plurality of sensing conductor segments 430 arranged in a second direction (Y-direction), wherein the plurality of sensing conductor segments 430 arranged in the second direction are separated by the plurality of scan lines 420. More, specifically, as shown in FIG. 4, the plurality of sensing conductor segments 430 are deemed as a plurality of sensing conductor segment line arranged in the second direction, each sensing conductor segment line having several sensing conductor segments 430 aligned in the second direction while two aligned adjacent sensing conductor segments 430 are separated by a corresponding scan line 420. Each of the plurality of sensing conductor segments 430 arranged in the second direction includes two ends respectively having a first extension part 431 and a second extension part 433 arranged in the first direction and extended toward two sides of the sensing conductor segment 430, in which the first direction is substantially vertical with the second direction.

Figure 5:
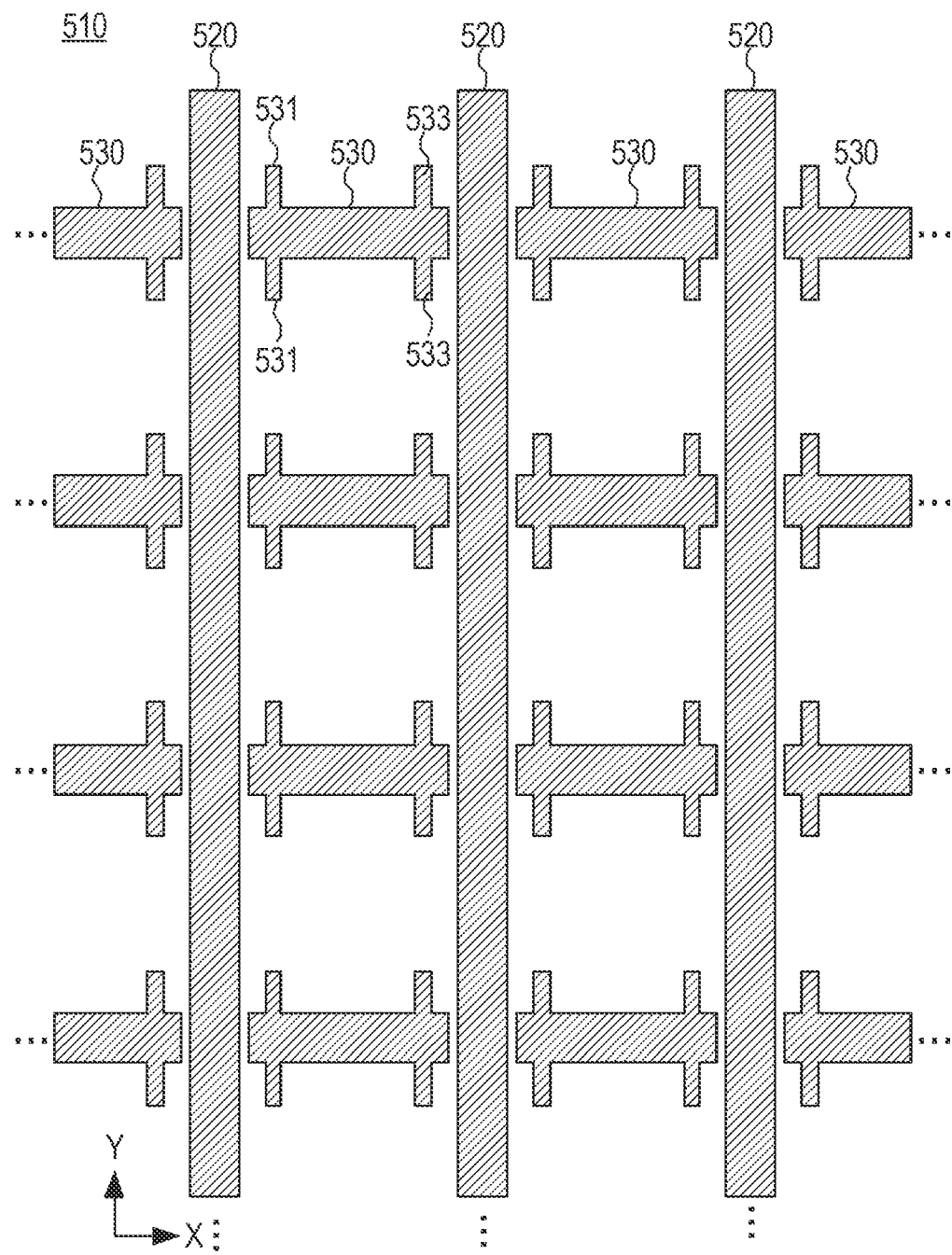
FIG. 5 schematically illustrates the data line sub-layer in accordance with the present invention.

FIG. 5 schematically illustrates the data line sub-layer 510 in accordance with the present invention. The data line sub-layer 510 is disposed at one side of the scan line sub-layer 410 facing the OLED layer 330 and has a plurality of data lines 520 arranged in the second direction (Y-direction) and a plurality of sensing conductor segments 530 arranged in the first direction (X-direction), wherein the plurality of sensing conductor segments 530 arranged in the first direction are separated by the plurality of data lines 520. More, specifically, as shown in FIG. 5, the plurality of sensing conductor segments 530 are deemed as a plurality of sensing conductor segment line arranged in the first direction, each sensing conductor segment line having several sensing conductor segments 530 aligned in the first direction while two aligned adjacent sensing conductor segments 530 are separated by a corresponding data line 520. Each of the plurality of sensing conductor segments 530 arranged in the first direction includes two ends respectively having a first extension part 531 and a second extension part 533 arranged in the second direction (Y-direction) and extended toward two sides of the sensing conductor segment 530.

Figure 6:
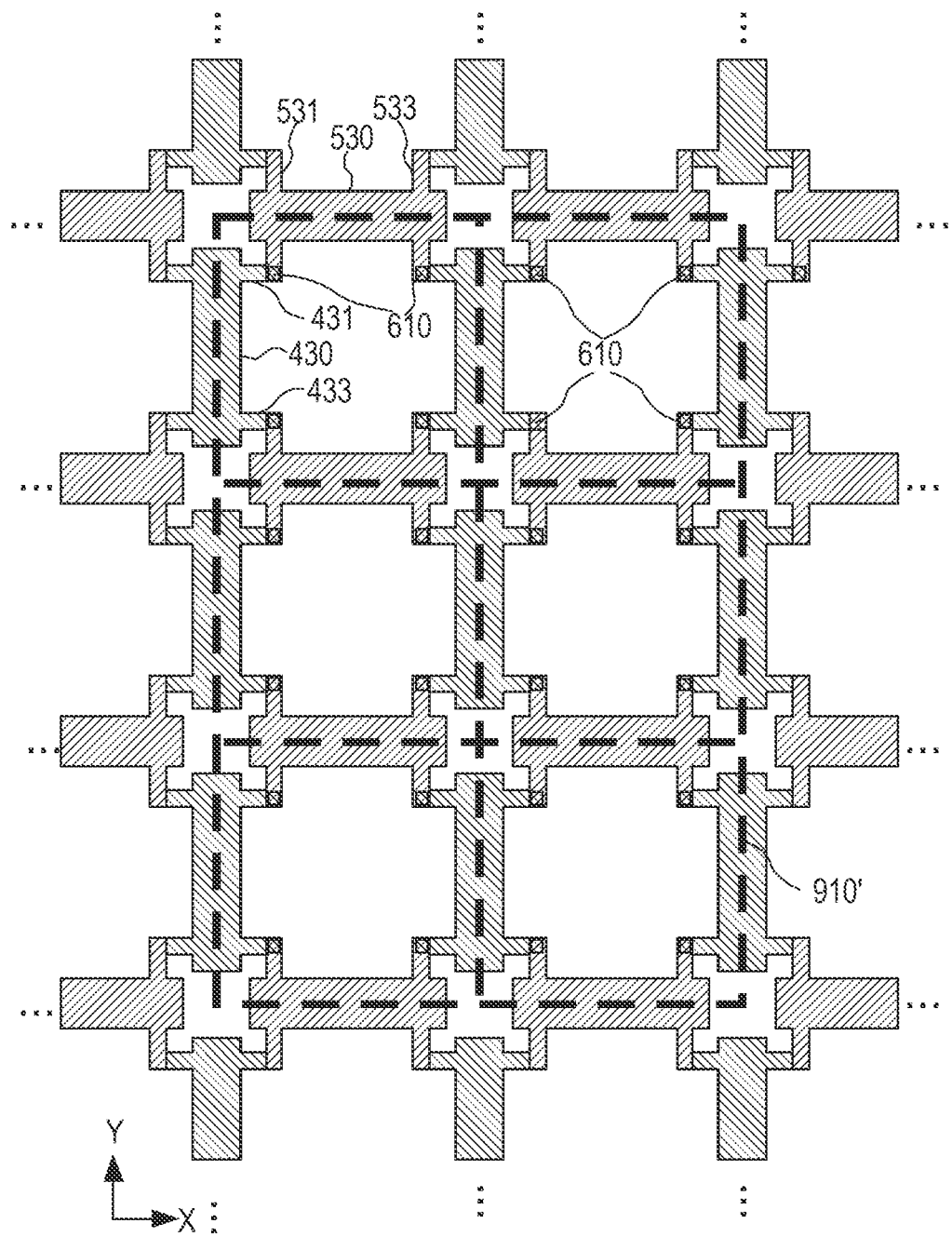
FIG. 6 schematically illustrates the electrical connection between the sensing conductor segments of scan line sub-layer and the sensing conductor segments of data line sub-layer in accordance with an embodiment of the present invention.

FIG. 6 schematically illustrates the electrical connection between the sensing conductor segments 430 of scan line sub-layer and the sensing conductor segments 530 of data line sub-layer in accordance with an embodiment of the present invention. The sensing conductor segments 430 and the sensing conductor segments 530 are respectively disposed at different layers, wherein the extension parts 431, 433, 531, 533 are partially overlapped, so that the extension part 431 or 433 may be electrically connected to the extension part 531 or 533 through a via hole 610.

Figure 7:
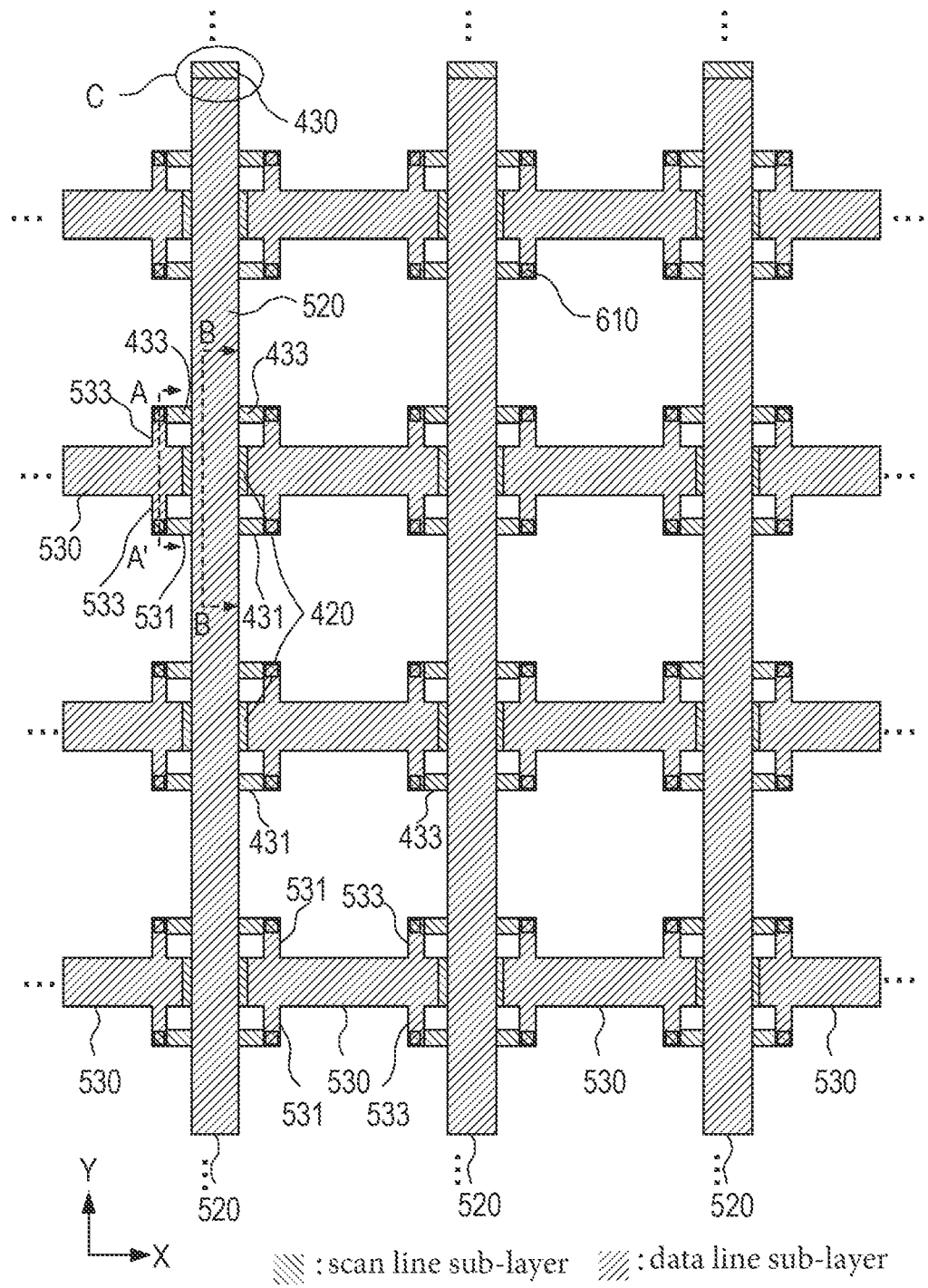
FIG. 7 schematically illustrates the electrical connection of the scan line sub-layer and the data line sub-layer in accordance with the present invention.

FIG. 7 schematically illustrates the electrical connection of the scan line sub-layer 410 and the data line sub-layer 510 in accordance with the present invention, which is viewed from the upper substrate 310 to the lower substrate 320, wherein ellipse C is used to mark the plurality of sensing conductor segments 430 arranged in the second direction, which are actually not visible from the upper substrate 310 to the lower substrate 320.

As shown in FIG. 7, the line width of the sensing conductor segment 530 arranged in the first direction is equal to the line width of the scan line 420, and the line width of the sensing conductor segment 430 arranged in the second direction is equal to the line width of the data line 520. In other embodiments, the line width of the sensing conductor segment 530 arranged in the first direction can be smaller than the line width of the scan line 420, and the line width of the plurality of sensing conductor segment 430 arranged in the second direction can be smaller than the line width of the data line 520.

In the present invention, the plurality of sensing conductor segments 430 arranged in the second direction are disposed at positions same as the positions of the data lines 520 but on different layers. Similarly, the plurality of sensing conductor segments 530 arranged in the first direction are disposed at positions same as the positions of the scan lines 420 but on different layers. In the present invention, the plurality of sensing conductor segments 430 arranged in the second direction and the plurality of sensing conductor segments 530 arranged in the first direction are disposed at positions corresponding to the positions of the plurality of scan lines 420 and the plurality of data lines 520.

FIG. 8(A) and FIG. 8(B) are two cross sectional views taking along A-A' and B-B' lines of FIG. 7, respectively. As shown in FIG. 8(A), there is an insulation region 810 arranged between the scan line 420 and the second extension part 533 arranged in the second direction. The second extension part 533 arranged in the second direction is electrically connected to the first extension part 431 arranged in the first direction and the second extension part 433 arranged in the first direction through a via hole 610. There is an insulation region 810 arranged between the scan line 420 and the data line 520.

Figure 9:
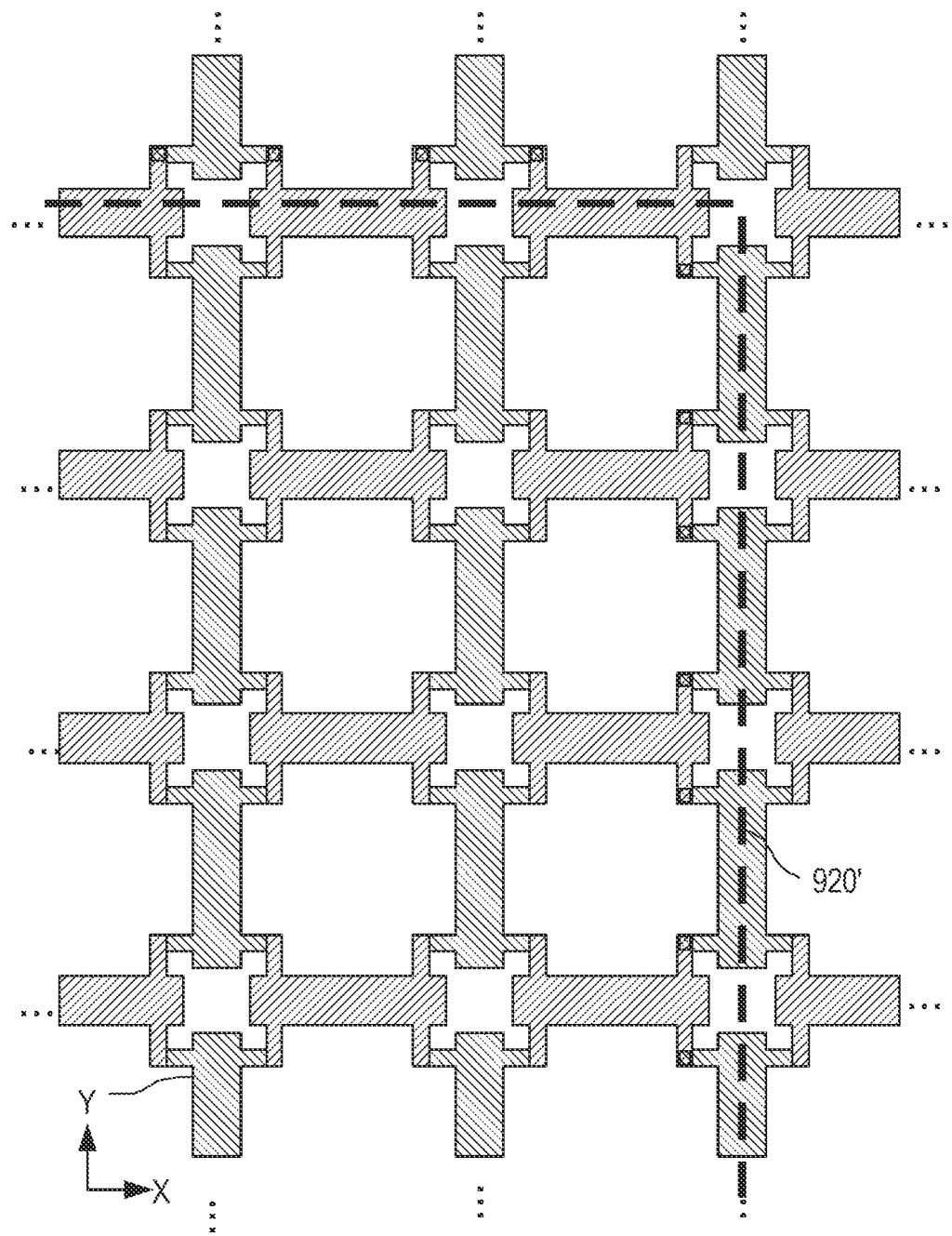
FIG. 9 schematically illustrates the electrical connection of the scan line sub-layer and the data line sub-layer in accordance with another embodiment of the present invention.

FIG. 9 schematically illustrates the electrical connection of the scan line sub-layer and the data line sub-layer in accordance with another embodiment of the present invention. As shown in FIGS. 6 and 9, the plurality of sensing conductor segments 430 arranged in the second direction and the plurality of sensing conductor segments 530 arranged in the first direction are formed with a quadrilateral region 910' and a trace 920', respectively. That is, the plurality of sensing conductor segments 430 arranged in the second direction and the plurality of sensing conductor segments 530 arranged in the first direction are formed with a first group of sensing conductor lines and a second group of sensing conductor lines, respectively, by electrically connecting the extension parts 431, 433 to the overlapped extension parts 531, 533 selectively. The first group of sensing conductor lines is formed with N quadrilateral regions, wherein the sensing conductor lines in any one of the quadrilateral regions are electrically connected together while the sensing conductor lines in any two quadrilateral regions are not electrically connected, so as to form a touch pattern on the thin film transistor and sensing electrode layer 340. The second group of sensing conductor lines is formed with N conductive traces, wherein each of the N conductive traces is electrically connected to a corresponding quadrilateral region while any two conductive traces are not electrically connected.

Figure 10:
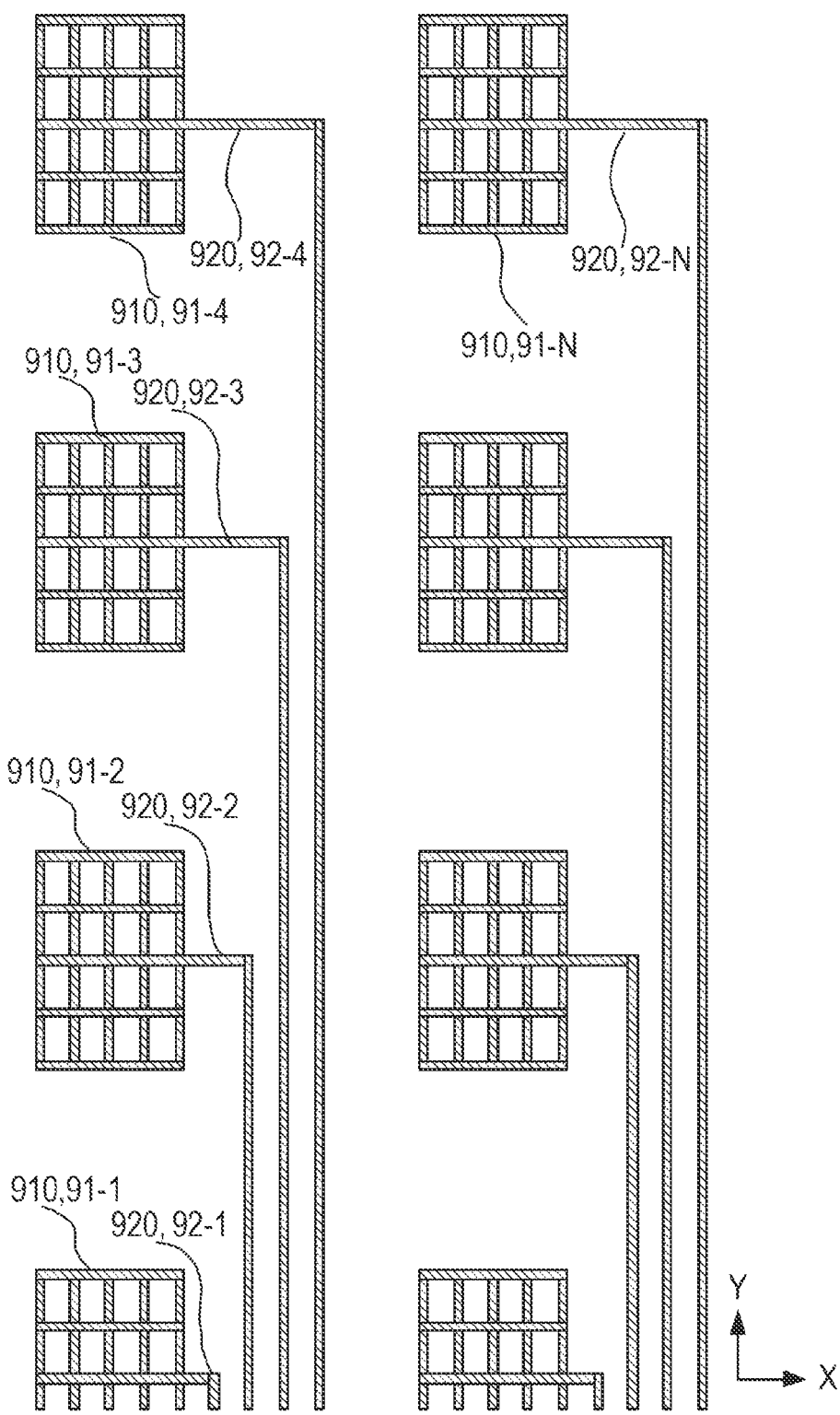
FIG. 10 schematically illustrates the quadrilateral regions and corresponding traces in accordance with the present invention.

FIG. 10 schematically illustrates the quadrilateral regions and corresponding traces in accordance with the present invention, which is viewed from the upper substrate 310 to the lower substrate 320. As shown in FIG. 10, the plurality of sensing conductor segments 430 arranged in the second direction and the plurality of sensing conductor segments 530 arranged in the first direction of the thin film transistor and sensing electrode layer 340 are arranged in the first direction (X-direction) and second direction (Y-direction), wherein the first direction is substantially vertical with the second direction. The plurality of sensing conductor segments 430 arranged in the second direction and the plurality of sensing conductor segments 530 arranged in the first direction of the thin film transistor and sensing electrode layer 340 are made of conductive metal material or alloy material, wherein the conductive metal material is selectively to be chromium, barium, aluminum, titanium, copper, silver, gold, platinum and alloy thereof.

The figures in the present invention are regarded in an illustrative sense and may not be drawn to scale. Since the extension parts 431, 433, 531, 533 are made of conductive metal material or alloy material.

The plurality of sensing conductor segments 430 arranged in the second direction and the plurality of sensing conductor segments 530 arranged in the first direction are formed with a first group of sensing conductor lines 910 and a second group of sensing conductor lines 920. The first group of sensing conductor lines 910 is formed with N quadrilateral regions 91-1 to 91-N, where N is a positive integer. The sensing conductor lines in any one of the quadrilateral regions are electrically connected together while the sensing conductor lines in any two quadrilateral regions are not electrically connected, so as to form a touch pattern on the thin film transistor and sensing electrode layer 340.

Each of the quadrilateral regions 91-1 to 91-N is formed in a rectangle, square, or rhombus shape. In this embodiment, each of the quadrilateral regions 91-1 to 91-N is formed in a rectangle shape.

The second group of sensing conductor lines 920 is formed with N conductor traces 92-1 to 92-N. Each of the N conductor traces is electrically connected to a corresponding quadrilateral region 91-1 to 91-N while any two conductor traces 92-1 to 92-N are not electrically connected.

The first group of sensing conductor lines 910 is correspondingly connected to the second group of sensing conductor lines 920. Therefore, the first group of sensing conductor lines 910 can form a touch pattern on the thin film transistor and sensing electrode layer 340.

With reference to FIG. 3 again, the thin film transistor and sensing electrode layer 340 is disposed at one side of the lower substrate 320 that faces the OLED layer 330. In addition to the plurality of scan lines 420 and plurality of data lines 520, the thin film transistor and sensing electrode layer 340 also includes a plurality of pixel transistors 341. The thin film transistor and sensing electrode layer 340 is used to drive a corresponding pixel transistor 341 for executing display operation according to a display pixel signal and a display driving signal.

The anode layer 360 is disposed at one side of the lower substrate 320 facing the OLED layer 330 and includes a plurality of anode pixel electrodes 361. Each of the plurality of anode pixel electrodes 361 is corresponding to one of the plurality of pixel transistor 341 of the thin film transistor and sensing electrode layer 340. That is, each of the plurality of anode pixel electrodes is connected to a source/drain of the corresponding pixel transistor 341, so as to form a pixel electrode of a specific color, such as a red pixel electrode, a green pixel electrode, or a blue pixel electrode.

The cathode layer 350 is disposed at one side of the upper substrate 310 facing the OLED layer 330 and between the upper substrate 310 and the OLED layer 330. The cathode layer 350 is formed with metal material, preferably metal material with thickness being less than 50 nm. The metal material is selectively to be alloy of aluminum, silver, magnesium, calcium, potassium, lithium, indium, or mixture of lithium fluoride, magnesium fluoride, lithium oxide and aluminum. Due to the thickness of the cathode layer 350 being less than 50 nm, the light generated by the OLED layer 330 can pass through it, so as to show images on the upper substrate 310. The cathode layer 350 is electrically connected in the whole piece, so that it can be used as a shielding. Moreover, the cathode layer 350 also receives the current coming from the anode pixel electrode 361.

The OLED layer 330 includes a hole transporting layer 331, an emitting layer 333, and an electron transporting layer 335.

In view of the foregoing, it is known that the present invention is capable of forming a touch pattern on the thin film transistor and sensing electrode layer 340, which has the advantage of not requiring to arrange a sensing electrode layer on the upper glass substrate or lower glass substrate of the LCD panel, thereby lowering the cost and decreasing the number of manufacturing steps.

Meanwhile, the plurality of sensing conductor segments 430 arranged in the second direction in accordance with the present invention can be defined on the mask used in the conventional skill for defining the plurality of scan lines 420, and the plurality of sensing conductor segments 530 arranged in the first direction in accordance with the present invention can be defined on the mask used in the conventional skill for defining the plurality of data lines 520. Accordingly, the number of manufacturing steps is not increased and thus the display panel is provided with touch function without adding any new manufacturing step.

Although the present invention has been explained in relation to its preferred embodiment, it is to be understood that many other possible modifications and variations can be made without departing from the spirit and scope of the invention as hereinafter claimed.

What is claimed is:

1. An OLED touch display panel structure, comprising:
   an upper substrate;
   a lower substrate parallel to the upper substrate;
   an OLED layer configured between the upper substrate and the lower substrate;
   a cathode layer disposed at one side of the upper substrate facing the OLED layer;
   an anode layer disposed at one side of the lower substrate facing the OLED layer, the anode layer including a plurality of anode pixel electrodes; and
   a thin film transistor and sensing electrode layer disposed between the lower substrate and the anode layer, wherein the thin film transistor and sensing electrode layer includes:
   a scan line sub-layer having a plurality of scan lines arranged in a first direction and a plurality of sensing conductor segments arranged in a second direction, the plurality of sensing conductor segments arranged in the second direction being separated by the plurality of scan lines; and
   a data line sub-layer disposed at one side of the scan line sub-layer facing the OLED layer, the data line sub-layer having a plurality of data lines arranged in the second direction and a plurality of sensing conductor segments arranged in the first direction, the plurality of sensing conductor segments arranged in the first direction being separated by the plurality of data lines.

2. The OLED touch display panel structure as claimed in claim 1, wherein the plurality of sensing conductor segments arranged in the second direction and the plurality of sensing conductor segments arranged in the first direction are disposed corresponding to positions of the plurality of scan lines and the plurality of data lines.

3. The OLED touch display panel structure as claimed in claim 2, wherein each of the plurality of sensing conductor segments arranged in the second direction includes two ends respectively having a first extension part and a second extension part arranged in the first direction, and each of the plurality of sensing conductor segments arranged in the first direction includes two ends respectively having a first extension part and a second extension part arranged in the second direction, where the extension parts arranged in the first direction are partially overlapped with the extension parts arranged in the second direction.

4. The OLED touch display panel structure as claimed in claim 3, wherein the plurality of sensing conductor segments arranged in the second direction and the plurality of sensing conductor segments arranged in the first direction are formed with a first group of sensing conductor lines and a second group of sensing conductor lines by electrically connecting the extension parts arranged in the first direction to the overlapped extension parts arranged in the second direction selectively, the first group of sensing conductor lines being formed with N quadrilateral regions, where N is a positive integer, the sensing conductor lines in any one of the quadrilateral regions being electrically connected together while the sensing conductor lines in any two quadrilateral regions are not electrically connected, so as to form a touch pattern on the thin film transistor and sensing electrode layer.

5. The OLED touch display panel structure as claimed in claim 4, wherein the second group of sensing conductor lines is formed with N conductive traces, each of the N conductive traces being electrically connected to a corresponding quadrilateral region, while any two conductive traces are not electrically connected.

6. The OLED touch display panel structure as claimed in claim 5, wherein the first direction is vertical with the second direction.

7. The OLED touch display panel structure as claimed in claim 6, wherein each of the quadrilateral regions is formed in a rectangle, square, or rhombus shape.

8. The OLED touch display panel structure as claimed in claim 7, wherein the plurality of sensing conductor segments arranged in the second direction and the plurality of sensing conductor segments arranged in the first direction of the thin film transistor and sensing electrode layer are made of conductive metal material or alloy material.

9. The OLED touch display panel structure as claimed in claim 8, wherein the conductive metal material is selectively to be chromium, barium, aluminum, titanium, copper, silver, gold, platinum and alloy thereof.

10. The OLED touch display panel structure as claimed in claim 1, wherein the cathode layer is formed with metal material.

11. The OLED touch display panel structure as claimed in claim 10, wherein the metal material is selectively to be alloy of aluminum, silver, magnesium, calcium, potassium, lithium, indium, or mixture of lithium fluoride, magnesium fluoride, lithium oxide and aluminum.

12. The OLED touch display panel structure as claimed in claim 11, wherein the OLED layer includes a hole transporting layer, an emitting layer, and an electron transporting layer.

* * * * *